United States Patent [19]
Lee et al.

[11] Patent Number: 6,087,722
[45] Date of Patent: Jul. 11, 2000

[54] MULTI-CHIP PACKAGE

[75] Inventors: Kwan Jai Lee, Suwon; Young Jae Song, Seongnam; Do Soo Jeong; Tae Je Cho, both of Suwon; Suk Hong Chang, Yongin; Chang Cheol Lee, Asan; Beung Seuck Song; Jong Hee Choi, both of Suwon, all of Rep. of Korea

[73] Assignee: Samsung Electronics Co., Ltd., Rep. of Korea

[21] Appl. No.: 09/291,913

[22] Filed: Apr. 14, 1999

[30] Foreign Application Priority Data

May 28, 1998 [KR] Rep. of Korea ............ 98-19523

[51] Int. Cl.⁷ .................................... H01L 23/48
[52] U.S. Cl. .................... 257/723; 257/669; 257/686; 257/692; 257/724; 257/777; 257/783
[58] Field of Search .................... 257/686, 692, 257/669, 724, 777, 783

[56] References Cited

U.S. PATENT DOCUMENTS

| | | | |
|---|---|---|---|
| 5,291,061 | 3/1994 | Ball | 257/783 |
| 5,323,060 | 6/1994 | Fogal et al. | 257/783 |
| 5,463,253 | 10/1995 | Waki et al. | 257/783 |
| 5,530,292 | 6/1996 | Waki et al. | 257/777 |
| 5,640,044 | 6/1997 | Takehashi et al. | 257/669 |
| 5,737,191 | 4/1998 | Horiuchi et al. | 257/783 |
| 5,739,581 | 4/1998 | Chillara et al. | 257/724 |
| 5,814,881 | 9/1998 | Alagratnam et al. | 257/686 |

FOREIGN PATENT DOCUMENTS

| | | | |
|---|---|---|---|
| 401235363 | 9/1989 | Japan | 257/783 |
| 402275655 | 11/1990 | Japan | 257/724 |
| 405013665 | 1/1993 | Japan | 257/724 |
| 363052461 | 3/1998 | Japan | 257/724 |

*Primary Examiner*—Mahshid Saadat
*Assistant Examiner*—Edgardo Ortiz
*Attorney, Agent, or Firm*—Skjerven, Morrill, MacPherson, Franklin & Friel LLP; David T. Millers

[57] ABSTRACT

A multi-chip stack package does not include a die pad. The elimination of the die pad provides more room for elements in the package which. Thus, a balanced inner package structure can be achieved, and a poor molding which may expose one of the package elements can be avoided. In the package, an upper chip is bonded to the top surface of a lower chip. To stabilize the chips, auxiliary or inner leads of a lead frame attach to the top surface of a lower chip. This shortens wire lengths between the chips and the inner leads. The shorter wires reduce wire loop heights and thus reduce the probability of exposing wires in a subsequent transfer-molding. A multi-chip stack package which includes an auxiliary lead(s) is also disclosed. The auxiliary leads attach to the top surface of the lower chip and can provide a stable support of a semiconductor chip and prevent the chip from tilting and shifting in transfer-molding. An auxiliary lead can be between the lower and upper chips. The auxiliary leads can also be positioned to prevent undesirable spreading of an adhesive when an upper chip is attached to a lower chip.

11 Claims, 5 Drawing Sheets

MULTI-CHIP PACKAGE

BACKGROUND OF THE INVENTION

1. Field of the Invention

The present invention relates to semiconductor chip packages, and more particularly, to multi-chip packages.

2. Description of the Related Arts

Electronic appliances are becoming smaller and lighter as a result of developments in the semiconductor industry and users' demands. One of the technologies for providing compact integrated circuitry for use in such appliances is multi-chip packaging. With multi-chip packaging, multiple semiconductor chips are mounted on a leadframe to form a single package. Multi-chip packaging is often applied to integrated circuits used in cellular telephones where miniaturization and light weight are critical. For these uses, multiple memories, such as Flash memory, synchronous DRAM, etc., are packaged into a single package, such as, a TSOP (thin small outline package). The chips can be enclosed in a single package in two ways, a three-dimensional stack package in which one chip is above another chip and a two-dimensional package in which chips are disposed in or on a horizontal plain. Between the two multi-chip packages, stack packaging is more efficient in minimizing the footprint of the package but is more complicated and has greater difficulty in guaranteeing a definite package thickness.

FIG. 1 is a sectional view of a conventional multi-chip stack package 60. In multi-chip package 60, an adhesive 91 attaches a first chip 61 to a second chip 71, and an adhesive 92 attaches the second chip 71 to a die pad 82 of a leadframe. Active surfaces of chips 61 and 71 face upward. Inner leads 81 of package 60 are disposed around die pad 82, and bonding wires 93 and 94 connect bonding pads 62 and 72 of chips 61 and 71 to corresponding inner leads 81. After the wirebonding that attaches bonding wires 93 and 94, transfer-molding encapsulates chips 61 and 71, die pad 82, inner leads 81 and wires 93 and 94 with a molding compound and forms a package body 95. As shown in FIG. 1, die pad 82 is below the level of inner leads 81. The difference of level between inner leads 81 and die pad 82 is called the "down-set".

Multi-chip package 60 has a structure similar to a conventional plastic package, and thus a large part of conventional plastic packaging technology can be applied to multi-chip package 60. However, stacking multiple chips in a package with a limited thickness may require thinning of a semiconductor wafer after integrated circuit fabrication. A large wafer with an 8 or 12 inch diameter may break during a thinning process such as back-lapping or during handling of the wafer after the thinning. In addition, multi-chip package 60 may require a thin package body 95 above first chip 61 and below die pad 82, and a low height of wire 93 so as to meet package thickness limitation. However, the length of wire 93 may be so long due to the structure of package 60 that controlling the height of wire 93 is difficult. As a result, a poor transfer molding can expose wire 93, first chip 61 or die pad 82. Accordingly, selecting optimal thicknesses for wafers or the package body of package 60 in the conventional multi-chip stack package is difficult. Therefore, a multi-chip stack package structure that provides a wider process window of manufacturing the package is needed.

SUMMARY OF THE INVENTION

According to an embodiment of the present invention, a multi-chip stack package includes: a first chip; a second chip on which the first chip is attached; and a leadframe which attaches to the second chip. The first and second chips face upward, and inner leads or auxiliary leads of the leadframe attach to an active surface of the second chip. Bonding wires electrically connect bonding pads of the first and second chips to corresponding inner leads, and the whole structure is encapsulated with a package body. Preferably, the leadframe has at least one auxiliary lead which is attached to the active surface of the second chip but is not electrically connected to either the first or second chip by the wires. The auxiliary lead attaches to a portion of the second chip that lacks bonding pads, and the first chip attaches to another portion of the active surface of the second chip. When attaching the first chip to the second chip, adhesive between the first and second chips spreads towards the electrode pads of the second chip. The auxiliary lead can have a bar shape or a square-ring shape that stops adhesive from spreading to the bonding pads.

In another embodiment of the present invention, a first auxiliary lead is between the first chip and the second chip. An optional second auxiliary lead attaches only to the active surface of the second chip.

BRIEF DESCRIPTION OF THE DRAWINGS

The features and advantages of the present invention will be more apparent to one skilled in the art in light of the following description and the accompanying drawings, in which.

Use of the same reference symbols in different figures indicates similar or identical items.

DETAILED DESCRIPTION

Figure 2:
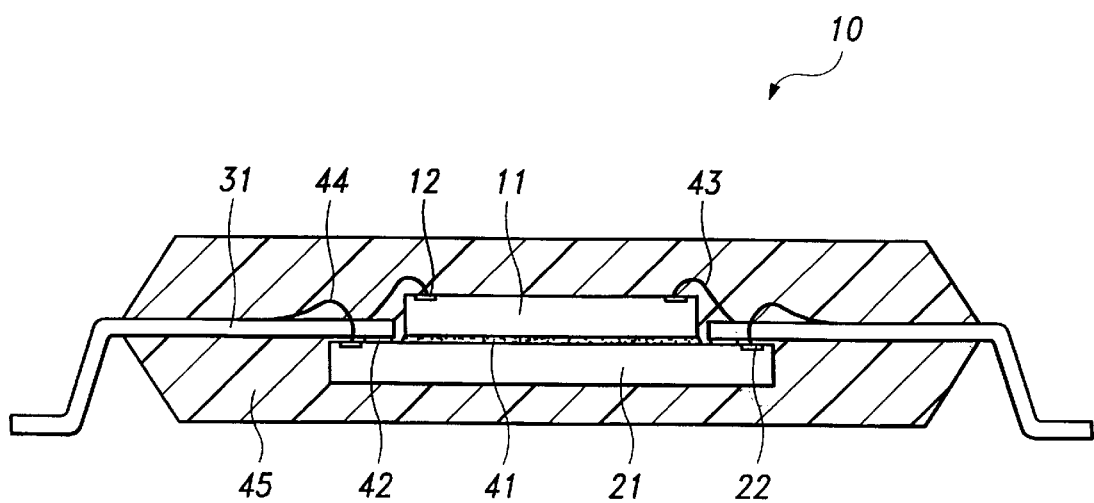
FIG. 2 is a sectional view of a multi-chip stack package according to an embodiment of the present invention.

Referring to FIG. 2, a multi-chip package 10 according to an embodiment of the present invention includes a first chip 11 having bonding pads 12 disposed along edges of an active surface of first chip 11, and a second chip 21 having bonding pads 22 disposed along edges of an active surface of second chip 21. First chip 11 is attached to second chip 21, and second chip 21 is attached to one or more inner leads 31 of a leadframe. In addition, metal wires 43 and 44 electrically connect bonding pads 12 and 22 to at least some of inner leads 31, and all of the elements are encapsulated with a package body 45 which is typically made of an epoxy molding compound. More specifically, an adhesive 41 such as an Ag-epoxy attaches a bottom surface of first chip 11 to the active (top) surface of second chip 21. An adhesive tape 42 (e.g., a polyimide tape) attaches inner leads 31 to an area of the active surface of second chip 21 that is not occupied by first chip 11 or bonding pads 22. Instead of adhesive tape 42, an adhesive can attach inner leads 31 to the active surface of second chip 21. In this case, the lead frame is prepared with adhesive is applied under the inner leads 31 that attach to second chip 21.

Figure 1:
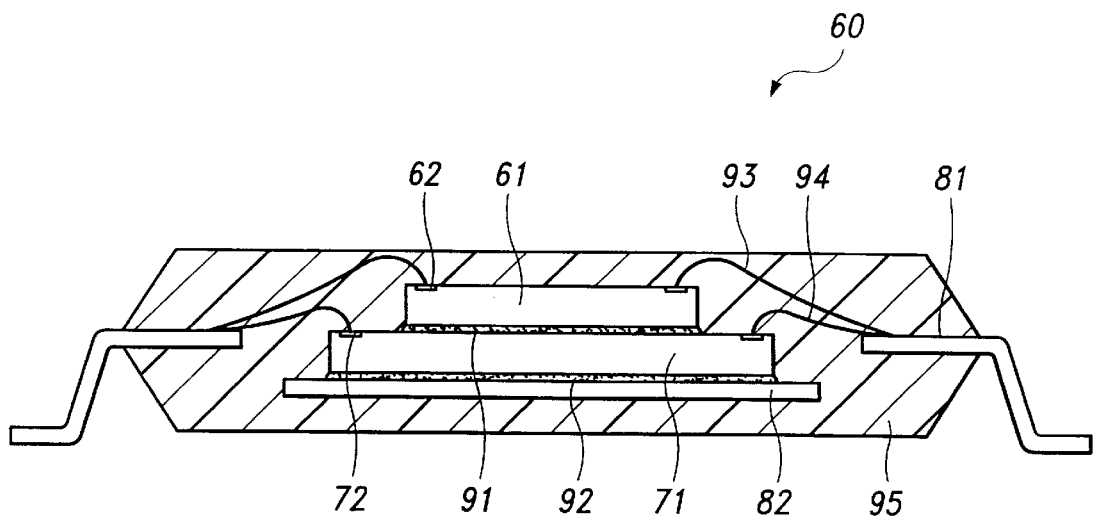
FIG. 1 is a sectional view of a conventional multi-chip stack package.

Multi-chip package 10 of FIG. 2 does not include a die pad on which the second chip was attached in the known package of FIG. 1. By eliminating the die pad, multi-chip package 10 has more room above and below chips 11 and 21. Therefore, when compared to known multi-chip packages, multi-chip package 10 may have fewer molding problems such as exposed chips or wires due to an unbalanced molding. In addition, since the distance from inner leads 31 to bonding pad 12 of first chip 11 is shorter than the distance from inner leads 81 to bonding pad 62 of first chip 61 of the prior art multi-chip package, the loop height of metal wire 43 can be controlled and lower than a loop height of metal wire 93 of FIG. 1. That is, the shorter distance between the inner leads and the bonding pads makes a wirebonding process easier and reduces a chance of exposing metal wires in a subsequent transfer-molding.

In FIG. 2, inner leads 31 support second chip 21. However, since the strength with which inner leads 31 hold second chip 21 may not be sufficient, an auxiliary lead(s) can be added to hold second chip 21 more firmly as shown in FIGS. 3 and 4.

Figure 3:
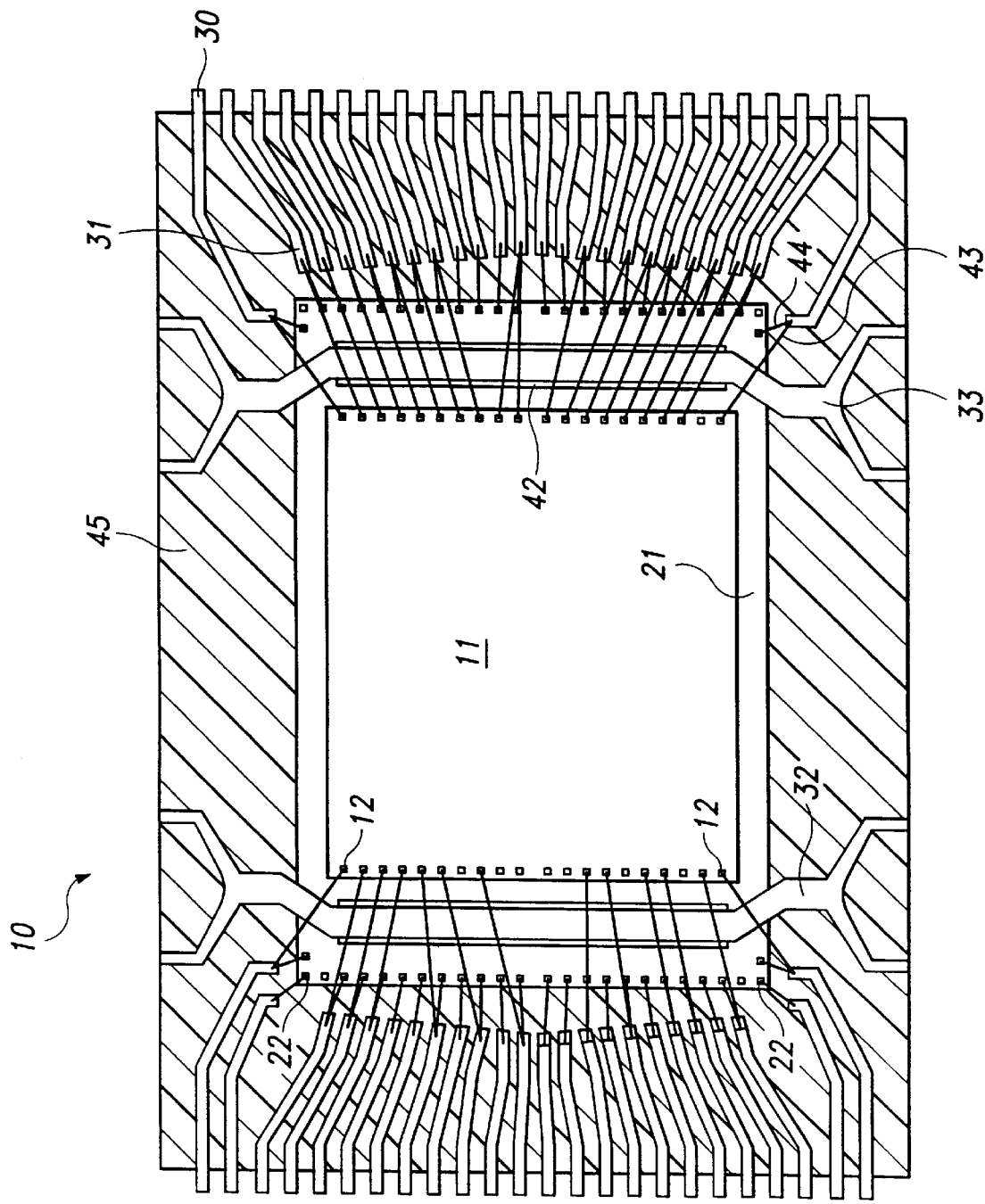
FIGS. 3 and 4 are plan views of structures in multi-chip stack packages according to other embodiments of the present invention.

Referring to FIG. 3, which illustrates the addition of the auxiliary leads to multi-chip package 10 of FIG. 2, a leadframe includes two bar-shaped auxiliary leads 32 and 33 which cross second chip 21 but do not occupy the surface area of second chip 21 that contains bonding pads 12 or first chip 11.

Auxiliary leads 32 and 33 can be attached to second chip 21 in the same way that inner leads 31 are attached to second chip 21 in FIG. 2. That is, an adhesive tape 42 or an adhesive can be used. Unlike inner leads 31 that attach to bonding pads 22, no metal wire 44 is bonded to auxiliary leads 32 and 33. Auxiliary leads 32 and 33 are preferably wider than inner leads 31 to provide a stable support to second chip 21. In addition, auxiliary leads 32 and 33 can prevent adhesive 41 (FIG. 3) from spreading to bonding pads 22 of second chip 21 when first chip 11 is attached to second chip 21 using a liquid adhesive.

Figure 4:
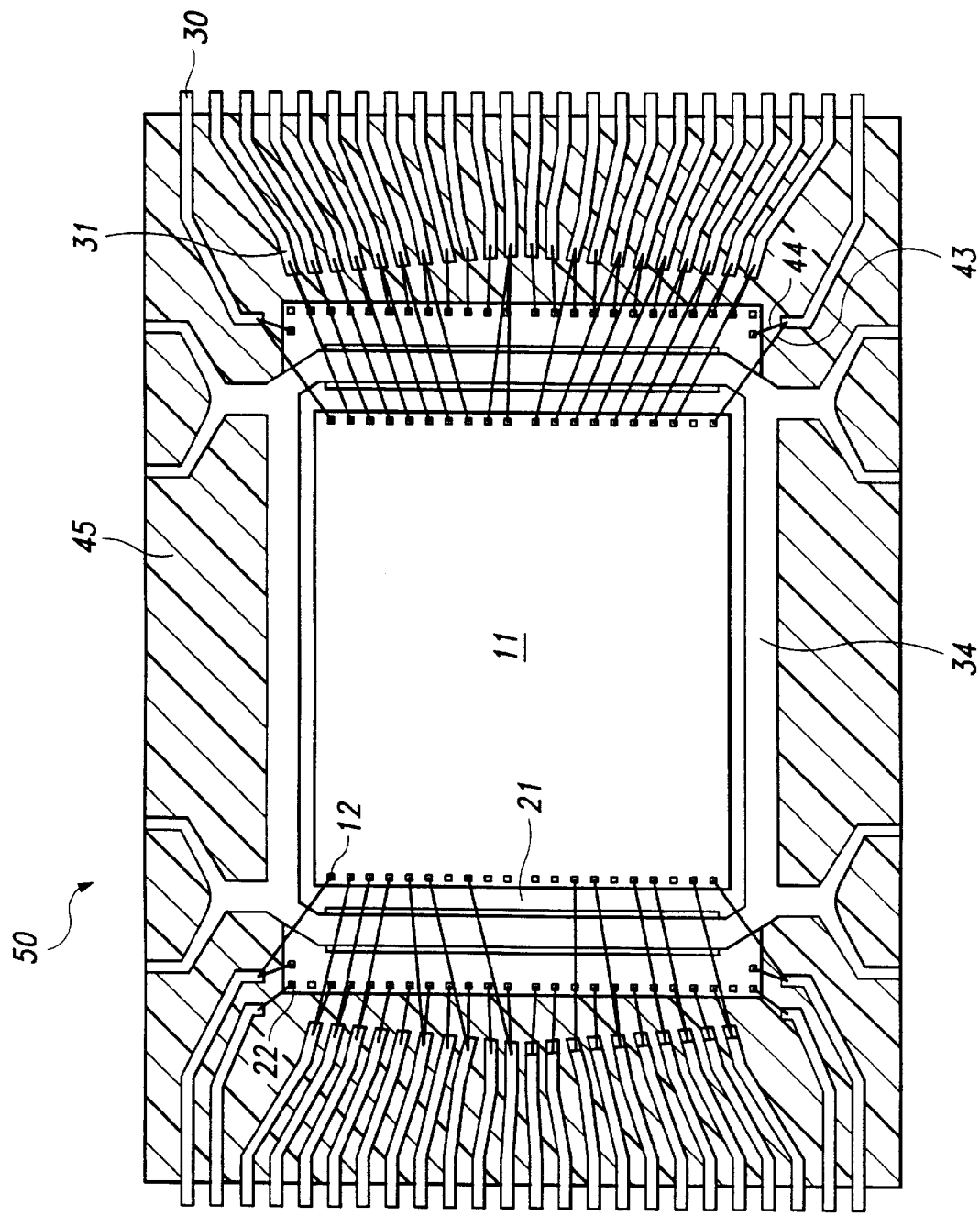

FIG. 4 shows a square-ring shaped auxiliary lead 34 which attaches to the periphery of second chip 21. Auxiliary lead 34 may provide a more stable support to second chip 21 and prevent the spreading of adhesive 41 more effectively than auxiliary leads 32 and 33 of FIG. 3.

Figure 5:
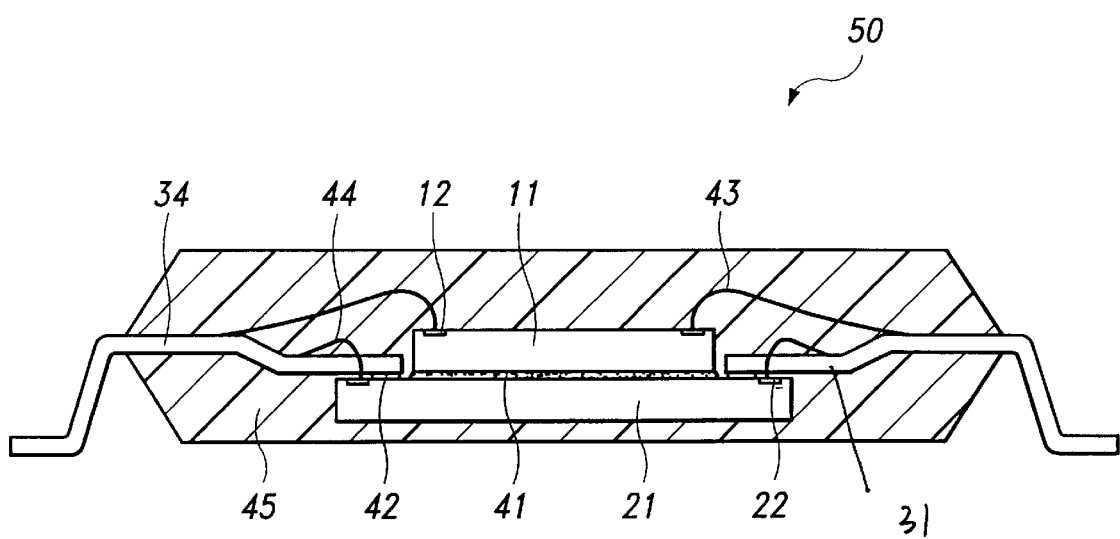
FIG. 5 is a sectional view of a multi-chip stack package according to yet another embodiment of the present invention.

FIG. 5 shows a multi-chip stack package 50 which differs from multi-chip stack package 10 of FIG. 2 in that inner leads 31 that connect to second chip 21 have a down-set so that inner parts of inner leads 34 are downwardly stepped. The down-set increases the vertical distance between metal wires 43, which attach to first chip 11, and metal wires 44, which attach to second chip 21. This reduces the probability that metal wires 43 and 44 will contact each other.

Figure 6:
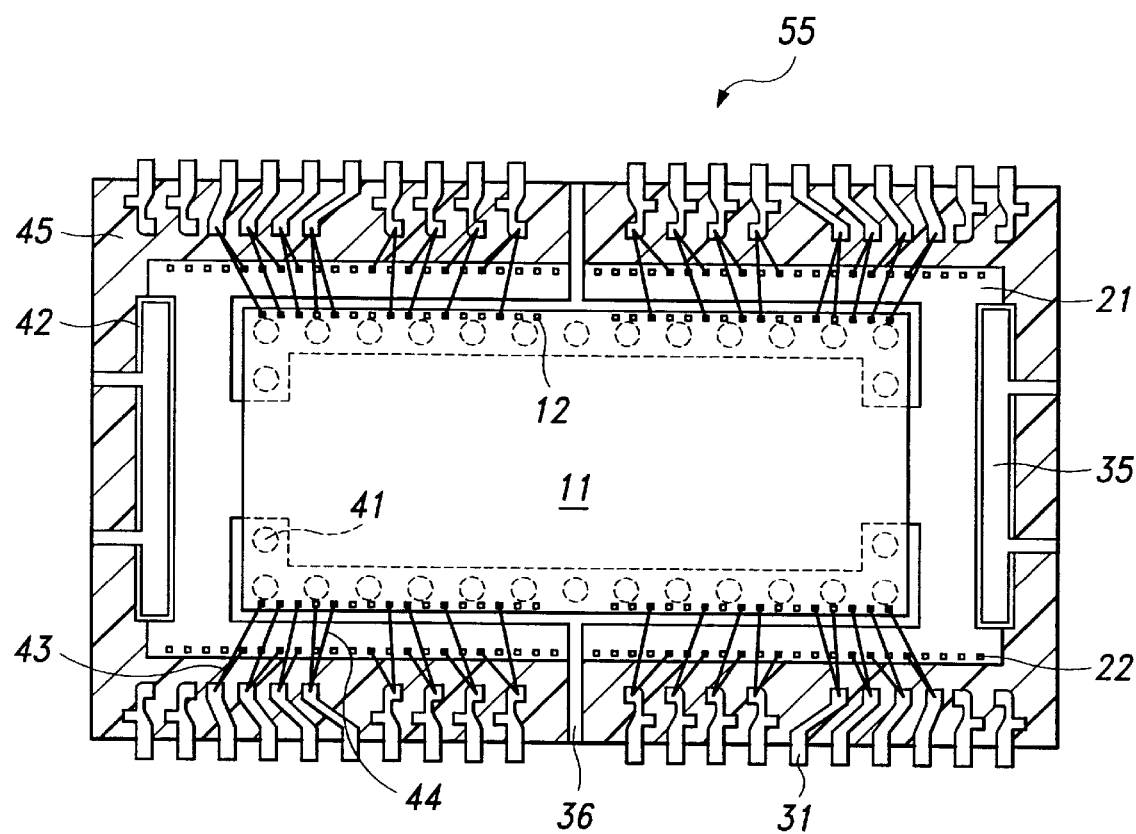
FIG. 6 is a plan view of structure in a multi-chip stack package according to still another embodiment of the present invention.

FIG. 6 shows a multi-chip stack package 55 which includes auxiliary leads 35 and 36. Auxiliary lead 36 is sandwiched and attached between first chip 11 and second chip 21. Auxiliary lead 35 attaches to second chip 21 but is not between chips 11 and 21. Referring to FIG. 6, first chip 11 and second chip 21 have bonding pads 12 and 22 along edges of the active surfaces thereof, and both auxiliary leads 35 and 36 are bar-shaped. To form package 55, auxiliary leads 35 and 36 attach to second chip 21 in a way similar to that described with reference to FIG. 3, and then first chip 11 is attached to auxiliary lead 36 which is designed and disposed to receive first chip 11 thereon. An adhesive 41 is applied on auxiliary lead 36 before the attachment of first chip 11 to auxiliary lead 36.

As described above, multi-chip stack packages according to the invention provide several advantages over the prior art multi-chip stack package. First, the elimination of a die pad provides more room for all elements in the package. Thus, a balanced inner package structure can be achieved, and a poor molding which may expose one of the package elements can be avoided. Second, shorter wire lengths between semiconductor chips and inner leads reduce wire loop height and thus reduce the probability of exposing wires in a subsequent transfer-molding. Third, auxiliary leads provide a stable support of a semiconductor chip and prevent the chip from tilting and shifting in transfer-molding. Tilting or shifting of the elements within a package due to an unbalanced structure can cause a package to crack during a later process. Fourth, the auxiliary leads prevent undesirable spreading of adhesive when an upper chip is attached to a lower chip. Fifth, because an adhesive polyimide tape is used for attachment of auxiliary leads and semiconductor chips, the chip attachment process is simplified.

Although the invention has been described with reference to particular embodiments, the description is only an example of the inventor's application and should not be taken as a limitation. Various adaptations and combinations of features of the embodiments disclosed are within the scope of the invention as defined by the following claims.

What is claimed is:

1. A semiconductor package comprising:
    a first chip having bonding pads on an active surface thereof;
    a second chip on which said first chip is attached, said second chip having bonding pads on an active surface thereof;
    a plurality of inner leads which are attached to said active surface of said second chip;
    a plurality of metal wires which electrically connect said bonding pads of said first and second chips to said inner leads; and
    a package body which encapsulates said first chip, second chip, inner leads and metal wires,
    wherein said first chip is directly attached on said active surface of said second chip, and said first chip and said second chip face the same direction.

2. The semiconductor package according to claim 1, further comprising an auxiliary lead which is attached on said active surface of said second chip but not electrically connected to said bonding pads of either of said first chip and said second chip.

3. The semiconductor package according to claim 2, wherein said auxiliary lead has a square-ring shape attached to said second chip.

4. The semiconductor package according to claim 2, wherein said auxiliary lead has a bar shape.

5. The semiconductor package according to claim 1, wherein parts of said inner leads are downwardly stepped.

6. A semiconductor package comprising:
    a first chip having bonding pads on an active surface thereof;
    a second chip on which said first chip is attached, said second chip having bonding pads on an active surface thereof;
    a plurality of inner leads;
    a first auxiliary lead between said second chip and said first chip, said first auxiliary lead being attached both to said active surface of said second chip and to a back surface of said first chip;
    a plurality of metal wires which electrically connect said bonding pads of said first and second chips to said corresponding inner leads; and a package body which encapsulates said first chip, second chip, inner leads and metal wires, wherein said first chip is directly attached on said active surface of said second chip, and said first chip and said second chip face the same direction.

7. A semiconductor package comprising:

a first chip having bonding pads on an active surface thereof;

a second chip on which said first chip is attached, said second chip having bonding pads on an active surface thereof;

a plurality of inner leads;

a first auxiliary lead between said second chip and said first chip, said first auxiliary lead being attached both to said active surface of said second chip and to a back surface of said first chip;

a second auxiliary lead which is attached to said active face of said second chip;

a plurality of metal wires which electrically connect said bonding pads of said first and second chips to said corresponding inner leads; and a package body which encapsulates said first chip, second chip, inner leads and metal wires, wherein said first chip and said second chip face the same direction.

8. The semiconductor package according to claim 7, wherein said first auxiliary lead and said second auxiliary lead are bar-shaped.

9. A semiconductor package comprising:

a first chip having bonding pads;

a second chip having a first surface to which said first chip is attached, said second chip having bonding pads; and an auxiliary lead which is attached to said first surface of said second chip, wherein said first chip is directly attached on said active surface of said second chip, and said first chip and said second chip face the same direction.

10. The semiconductor package of claim 9, further comprising:

a plurality of inner leads;

a plurality of metal wires which electrically connect said bonding pads of said first and second chips to said inner leads; and a package body which encapsulates said first chip, second chip, inner leads and metal wires.

11. The semiconductor package of claim 10, wherein the bonding pads of said second chip are on said first surface of said second chip.

* * * * *